US012765046B2

(12) United States Patent
Tani et al.

(10) Patent No.: US 12,765,046 B2
(45) Date of Patent: Oct. 13, 2026

(54) SEMICONDUCTOR DEVICE HAVING A CONTROL SIGNAL OUTPUT TERMINAL AND POWER CONVERTER

(71) Applicant: Hitachi Power Semiconductor Device, Ltd., Ibaraki (JP)

(72) Inventors: Kazuki Tani, Tokyo (JP); Kenji Hara, Tokyo (JP)

(73) Assignee: MINEBEA POWER SEMICONDUCTOR DEVICE INC., Ibaraki (JP)

( * ) Notice: Subject to any disclaimer, the term of this patent is extended or adjusted under 35 U.S.C. 154(b) by 902 days.

(21) Appl. No.: 18/002,703

(22) PCT Filed: Apr. 19, 2021

(86) PCT No.: PCT/JP2021/015811
§ 371 (c)(1),
(2) Date: Dec. 21, 2022

(87) PCT Pub. No.: WO2022/024472
PCT Pub. Date: Feb. 3, 2022

(65) Prior Publication Data

US 2023/0246021 A1 Aug. 3, 2023

(30) Foreign Application Priority Data

Jul. 27, 2020 (JP) ................................ 2020-126296

(51) Int. Cl.
*H10D 84/80* (2025.01)
*H03K 17/10* (2006.01)
(Continued)

(52) U.S. Cl.
CPC ......... *H10D 84/811* (2025.01); *H03K 17/102* (2013.01); *H03K 17/122* (2013.01);
(Continued)

(58) Field of Classification Search
CPC ............. H10D 84/811; H10D 30/6713; H10D 62/152; H10D 86/201; H10D 30/657;
(Continued)

(56) References Cited

U.S. PATENT DOCUMENTS 5,495,118 A * 2/1996 Kinoshita ............ H10D 89/601
257/357
7,554,839 B2 * 6/2009 Bobde .................. H10D 89/711
365/72
(Continued)

FOREIGN PATENT DOCUMENTS

DE 10 2013 213 447 A1 1/2014
DE 10 2013 217 176 A1 3/2014
(Continued)

OTHER PUBLICATIONS

Office Action, mailed Jan. 17, 2026, for German Application No. 112021002923.1 (with English translation).
(Continued)

*Primary Examiner* — Caleb E Henry
*Assistant Examiner* — Pratiksha Jayant Lohakare
(74) *Attorney, Agent, or Firm* — Baker Botts L.L.P.

(57) ABSTRACT

The semiconductor device configures a cascode-type high voltage element comprising a plurality of low voltage elements connected in series, wherein the number of stages of connected low voltage elements is reduced, and the high voltage element has desired withstand voltage, without limiting the withstand voltage of the gate oxide film of the low voltage elements. The semiconductor device comprises a first semiconductor element and one or more second semiconductor elements connected in series, wherein the first and the second semiconductor elements have a control signal output terminal between a source terminal and a drain terminal or between an emitter terminal and a collector
(Continued)

terminal; and a gate terminal of the one or more second semiconductor elements is connected to the control signal output terminal of the first or second semiconductor element connected in series adjacently to the source or emitter side of said one or more second semiconductor elements.

10 Claims, 7 Drawing Sheets

(51) Int. Cl.

| | |
|---|---|
| ***H03K 17/12*** | (2006.01) |
| ***H03K 17/687*** | (2006.01) |
| ***H10D 30/67*** | (2025.01) |
| ***H10D 62/13*** | (2025.01) |
| ***H10D 86/00*** | (2025.01) |

(52) U.S. Cl.
CPC ....... *H03K 17/687* (2013.01); *H10D 30/6713* (2025.01); *H10D 62/152* (2025.01); *H10D 86/201* (2025.01)

(58) Field of Classification Search
CPC .. H10D 84/151; H10D 12/421; H10D 64/111; H10D 84/82; H10D 84/83; H03K 17/102; H03K 17/122; H03K 17/687
USPC .......................................................... 257/379
See application file for complete search history.

(56) References Cited

U.S. PATENT DOCUMENTS 8,569,842 B2 * 10/2013 Weis ...................... H03K 17/06 257/272
9,024,317 B2 * 5/2015 Endo .................... G09G 3/3648 257/59
2002/0093094 A1 * 7/2002 Takagawa .............. H10D 84/83 257/E23.044
2006/0066512 A1 * 3/2006 Afentakis ................ G09G 3/20 345/55
2006/0238135 A1 * 10/2006 Kimura .................... G09G 3/20 315/169.3
2008/0079035 A1 * 4/2008 Bobde .................. H10D 89/711 257/273
2008/0151660 A1 * 6/2008 Inoue ..................... G11C 5/142 365/200
2012/0108963 A1 * 5/2012 Hara .................. H03K 17/6874 327/333
2012/0175635 A1 7/2012 Weis et al.
2014/0015592 A1 1/2014 Weis
2014/0062585 A1 3/2014 Weis
2015/0171117 A1 * 6/2015 Endo .................. H10D 30/6755 257/296
2016/0155737 A1 6/2016 Linewih et al.
2016/0262228 A1 * 9/2016 Huang ................... H05B 45/31
2017/0084606 A1 3/2017 Meiser et al.
2020/0091911 A1 * 3/2020 Iwamizu .......... H03K 17/08122

FOREIGN PATENT DOCUMENTS

| | | | |
|---|---|---|---|
| DE | 10 2015 116 099 | B3 | 3/2017 |
| EP | 2 661 773 | B1 | 3/2016 |
| EP | 3 243 276 | B1 | 9/2019 |
| JP | 2004-054629 | A | 2/2004 |
| JP | 2019-091783 | A | 6/2019 |

OTHER PUBLICATIONS

International Search Report, mailed Jul. 13, 2021, for International Application No. PCT/JP2021/015811.

* cited by examiner

SEMICONDUCTOR DEVICE HAVING A CONTROL SIGNAL OUTPUT TERMINAL AND POWER CONVERTER

TECHNICAL FIELD

The present invention relates to a structure of a semiconductor device, and particularly to a technique effective for application to a cascode-type high voltage element configured by connecting a plurality of low voltage elements in series.

BACKGROUND

In the development of power semiconductor devices such as power transistors and power diodes, it is an important issue to manufacture a device having a low on-resistance and a small switching loss while having a high withstand voltage.

The power transistor is usually disposed between a body region and a drain region, and has a drift region doped to a lower concentration than the drain region. The on-resistance of a conventional power transistor depends on a length of the drift region in a direction in which a current flows and doping concentration of the drift region, and the on-resistance is reduced when the length of the drift region is reduced or the doping concentration of the drift region is increased.

However, there is a problem that a breakdown voltage of the device is reduced when the length of the drift region is reduced or the doping concentration of the drift region is increased.

As a method of reducing the on-resistance of the power transistor having a predetermined withstand voltage, a technique of providing a compensation region complementarily doped in the drift region, a technique of providing in the drift region a field plate that is dielectrically insulated from the drift region and connected to, for example, a gate or a source terminal of the transistor, and the like are well known.

In these types of power transistors, since a compensation zone or the field plate partially compensates for a doping charge in the drift region when the device is in an off state, the drift region can be doped at a higher concentration, and the on-resistance can be reduced without reducing the breakdown voltage. However, output capacities of these devices tend to increase.

As a background art of the present technical field, for example, there is a technique such as PTL 1. PTL 1 discloses a “semiconductor element capable of improving withstand voltage and reducing output capacity by autonomously controlling a plurality of power transistors by cascode connection.”

The technique of PTL 1 has not only an advantage in terms of performance of the power transistor such as improvement in withstand voltage, reduction in on-resistance, and reduction in switching loss, but also an advantage of simplification in design that the withstand voltage can be changed based on the number of connected cascode stages.

CITATION LIST

Patent Literature

PTL 1: US 2012/0175635 A

SUMMARY OF INVENTION

Technical Problem

However, since the technique disclosed in PTL 1 uses cascode connection in which a gate electrode is connected to a source electrode of a stage one below, withstand voltages of power transistors of second and subsequent stages are limited by a withstand voltage of a gate oxide film, and the withstand voltage is usually limited to about 20 V.

In order to obtain a high withstand voltage, it is necessary to increase the number of cascode connection stages, but there arises a problem that as the number of stages increases, the number of contacts connecting the power transistors also increases, and a parasitic resistance increases, or reliability of the gate is reduced.

For example, in a case where the gate of at least one of the power transistors connected in series is broken, all the power transistors at upper stages of the power transistor whose gate is broken are uncontrollable, and thus failure probability increases as the number of series stages increases.

Therefore, in order to achieve both a high withstand voltage and gate reliability, it is important to be able to freely design the number of stages of series connection of the power transistors in the second and subsequent stages of series connection for a certain target withstand voltage.

That is, there is a need for a semiconductor device in which the withstand voltages of the power transistors of the second and subsequent stages are not limited by the withstand voltage of the gate oxide film.

Therefore, an object of the present invention is to provide, in a cascode-type high voltage element configured by connecting a plurality of low voltage elements in series, a semiconductor device capable of forming a high voltage element having a desired withstand voltage without being limited to a withstand voltage of a gate oxide film of a low voltage element while reducing the number of stages of the low voltage elements to be connected, and a power converter using the semiconductor device.

Solution to Problem

In order to solve the above problems, the present invention provides a semiconductor device in which a first semiconductor element and one or a plurality of second semiconductor elements are connected in series, in which the first semiconductor element and the second semiconductor element each has a control signal output terminal between a source terminal and a drain terminal or between an emitter terminal and a collector terminal, and a gate terminal of the second semiconductor element is connected to the control signal output terminal of the first semiconductor element or the second semiconductor element connected in series adjacent to a source or emitter side of the second semiconductor element.

Advantageous Effects of Invention

According to the present invention, it is possible to provide, in the cascode-type high voltage element configured by connecting a plurality of low voltage elements in series, a semiconductor device capable of forming a high voltage element having a desired withstand voltage without being limited to the withstand voltage of the gate oxide film of the low voltage element while reducing the number of stages of the low voltage elements to be connected.

Problems, configurations, and effects other than those described above will be clarified by the following description of embodiments.

DESCRIPTION OF EMBODIMENTS

Figure 1A:
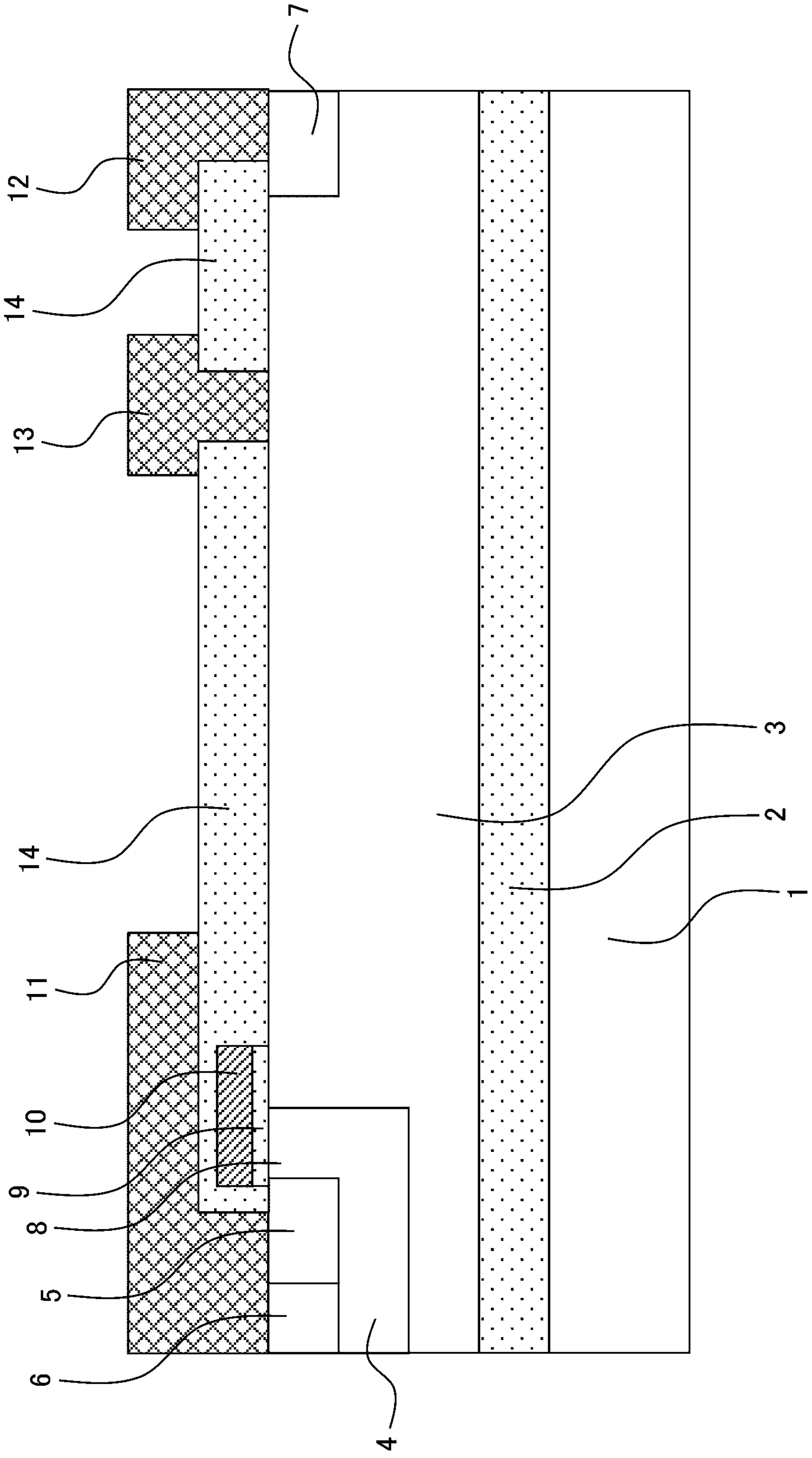
FIG. 1A is a diagram illustrating a cross-sectional structure of a semiconductor device according to a first embodiment of the present invention.

Hereinafter, embodiments of the present invention will be described with reference to the drawings. In the drawings, the same components are denoted by the same reference numerals, and detailed description of overlapping components is omitted.

First Embodiment

A semiconductor device according to a first embodiment of the present invention will be described with reference to FIGS. 1A to 4B. Note that FIGS. 1A to 3C illustrate an example in which a lateral MOSFET is used as a low voltage element constituting the semiconductor device, and FIGS. 4A and 4B illustrate an example in which an insulated gate bipolar transistor (IGBT) is used as a modification thereof.

FIG. 1A is a diagram illustrating a cross-sectional structure of the semiconductor device of the present embodiment. In the semiconductor device of the present embodiment, as illustrated in FIG. 1A, an n-type semiconductor substrate 3 serving as a drift region is formed on a support substrate 1 via a buried oxide film 2, a p-type base region 4 is selectively formed in a part of the n-type semiconductor substrate 3, an n-type source region 5 is formed in a part of a surface layer of the p-type base region 4, and a p-type contact region 6 is formed to be adjacent to the n-type source region 5.

An n-type drain region 7 is selectively formed in a part of a surface layer of the n-type semiconductor substrate 3 where the p-type base region 4 is not formed. Then, a gate electrode 10 connected to a gate terminal (not illustrated) via a gate oxide film 9 is provided on a surface of a channel region 8 of the surface layer of the p-type base region 4.

Further, a source electrode 11 in common contact with surfaces of the n-type source region 5 and the p-type contact region 6 is provided, a drain electrode 12 is provided on a surface of the n-type drain region 7, and they are respectively connected to a source terminal and a drain terminal (both not illustrated). A control signal output electrode 13 is formed on a part of a surface of the n-type semiconductor substrate (drift region) 3 between the p-type base region 4 and the n-type drain region 7, and is connected to a control signal output terminal (not illustrated). Note that a part of the surface of the n-type semiconductor substrate 3 is covered with a dielectric 14 for electrical insulation.

In the semiconductor device of the present embodiment, as illustrated in FIG. 1A, the control signal output electrode 13 is provided on a part of the surface of the n-type semiconductor substrate (drift region) 3 between the p-type base region 4 and the n-type drain region 7, and a potential of the control signal output terminal can be adjusted in a range from a potential of the source terminal to a potential of the drain terminal by a position where the control signal output electrode 13 is provided.

Figure 1B:
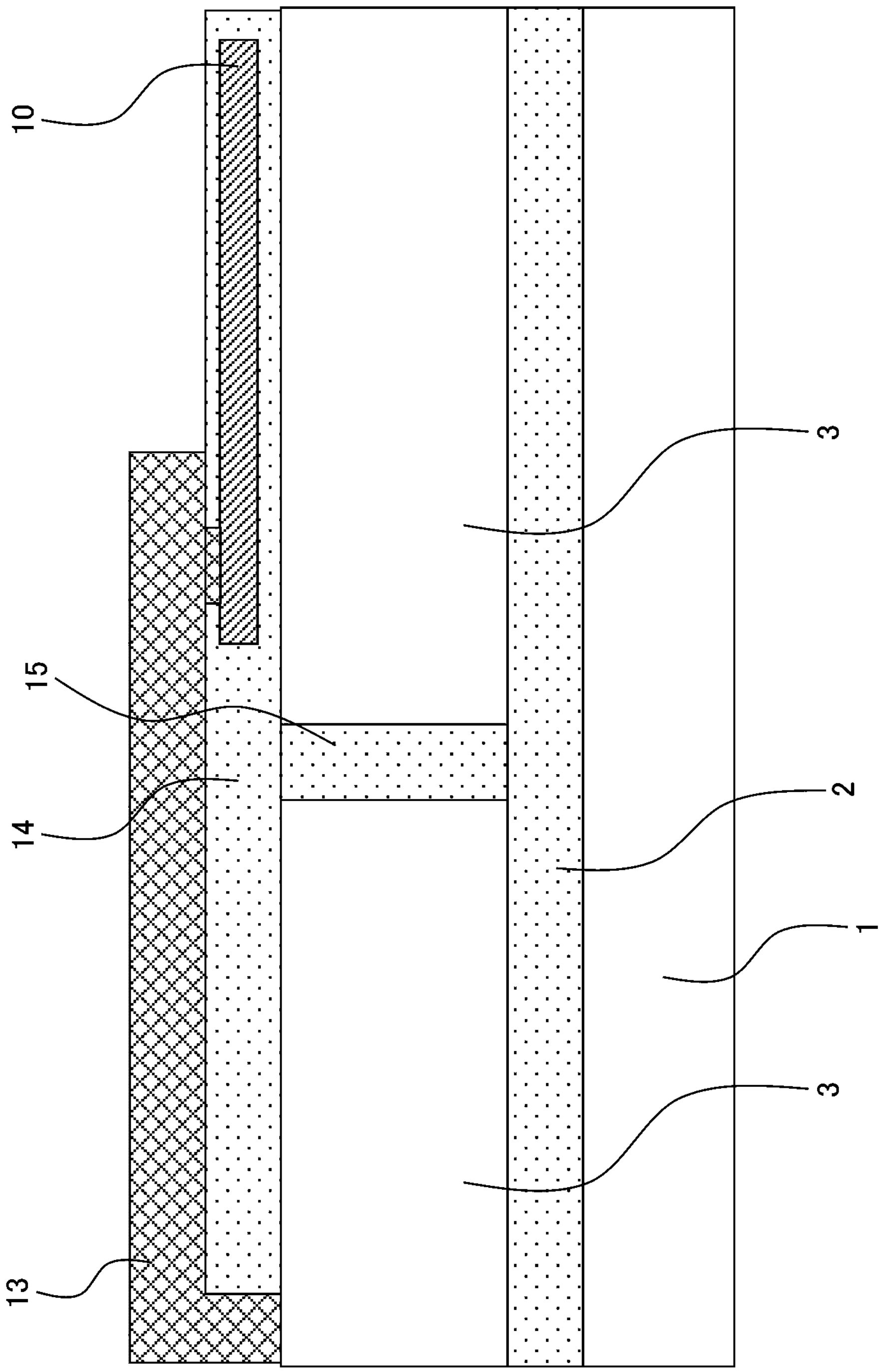
FIG. 1B is a diagram illustrating a connection structure between a control signal output electrode of a first stage MOSFET and a gate electrode of a second stage MOSFET.

FIG. 1B is a diagram illustrating a connection structure between a control signal output electrode of a first stage MOSFET and a gate electrode of a second stage MOSFET of the semiconductor device of the present embodiment.

In the semiconductor device of the present embodiment, as illustrated in FIG. 1B, the n-type semiconductor substrate (drift region) 3 on the buried oxide film 2 is separated into a first stage MOSFET region (left side of an element isolation region 15) and a second stage MOSFET region (right side of the element isolation region 15) by the element isolation region 15. Then, the control signal output electrode 13 of the first stage MOSFET and the gate electrode 10 of the second stage MOSFET are electrically connected.

Figure 1C:
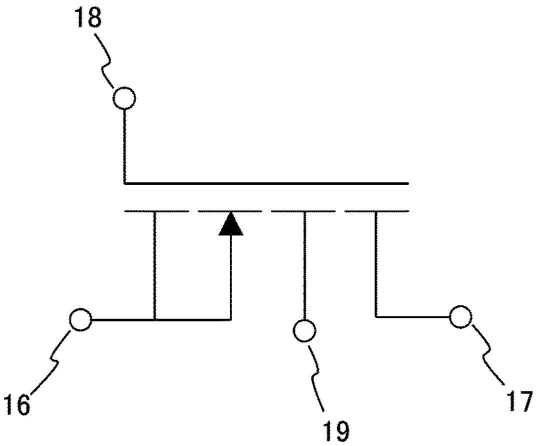
FIG. 1C is a circuit diagram of a low voltage element constituting the semiconductor device according to the first embodiment of the present invention.

FIG. 1C is a circuit diagram of the low voltage element constituting the semiconductor device of the present embodiment. A source terminal 16, a drain terminal 17, a gate terminal 18, and a control signal output terminal 19 in FIG. 1C correspond to a source terminal, a drain terminal, a gate terminal, and a control signal output terminal respectively connected to the source electrode 11, the drain electrode 12, the gate electrode 10, and the control signal output electrode 13 in FIG. 1A.

As illustrated in FIG. 1C, the low voltage element (lateral MOSFET) constituting the semiconductor device of the present embodiment is characterized in that the control signal output terminal 19 is added, as compared with a circuit configuration of a conventional lateral MOSFET.

Figure 2:
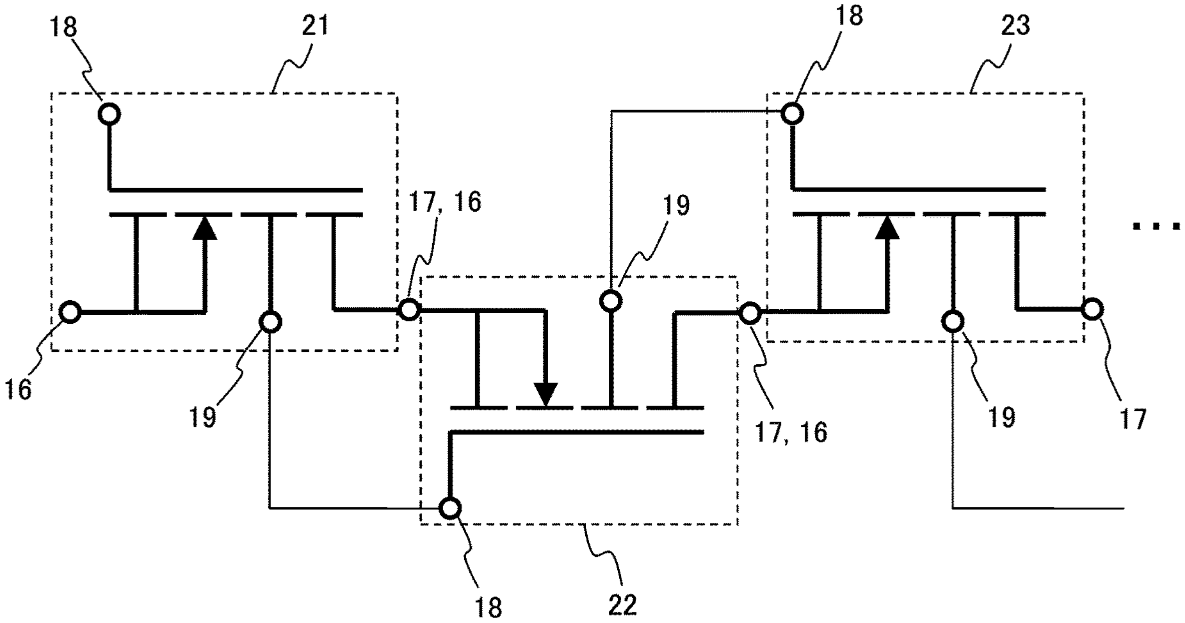
FIG. 2 is a circuit diagram illustrating a configuration of the semiconductor device according to the first embodiment of the present invention.

FIG. 2 is a circuit diagram illustrating a configuration of the semiconductor device of the present embodiment. The drain terminals 17 and the source terminals 16 of lateral MOSFETs 21, 22, and 23 provided with the control signal output electrode 13 are connected to each other, so that three lateral MOSFETs 21, 22, and 23 are connected in series. Although only the lateral MOSFETs 21, 22, and 23 are illustrated in FIG. 2 for the sake of simplicity, the number of lateral MOSFETs connected in series is not limited thereto, and it goes without saying that the number of series can be arbitrarily changed.

Further, second and subsequent stages (the lateral MOSFETs 22 and 23 in FIG. 2) connected in series are depletion-type MOSFETs in which a gate voltage threshold is a negative voltage, but a first stage (the lateral MOSFET 21 in FIG. 2) connected in series is not necessarily a depletion-type MOSFET, and may be an enhancement-type MOSFET in which the gate voltage threshold is a positive value.

The gate terminal 18 and the source terminal 16 of the lateral MOSFET 21 are connected to a gate drive circuit (not illustrated). Further, the gate terminals 18 of the second and subsequent stages of series connection of the lateral MOSFETs 22 and 23 are respectively connected to the control signal output terminals 19 of the lateral MOSFETs connected to source sides of the lateral MOSFETs.

Next, an operation of the semiconductor device of the present embodiment will be described. For example, when three lateral MOSFETs connected in series in FIG. 2 are connected to a power supply via a load and the lateral MOSFET 21 is turned from an off state to an on state by a gate drive circuit, a voltage from the control signal output terminal 19 to the drain terminal 17 (a voltage with reference to the control signal output terminal 19) is reduced together with a voltage from the source terminal 16 to the drain terminal 17 of the lateral MOSFET 21.

Since the voltage from the control signal output terminal 19 to the drain terminal 17 of the lateral MOSFET 21 is equal to a voltage from the gate terminal 18 to the source terminal 16 of the lateral MOSFET 22 (a voltage with reference to the gate terminal 18), a voltage from the source terminal 16 to the gate terminal 18 of the lateral MOSFET 22 (a voltage with reference to the source terminal 16) increases, and when the voltage exceeds a negative gate threshold voltage, the lateral MOSFET 22 is turned on, and the voltage from the source terminal 16 to the drain terminal 17 and the voltage from the control signal output terminal 19 to the drain terminal 17 of the lateral MSOFET 22 are reduced.

Figure 3A:
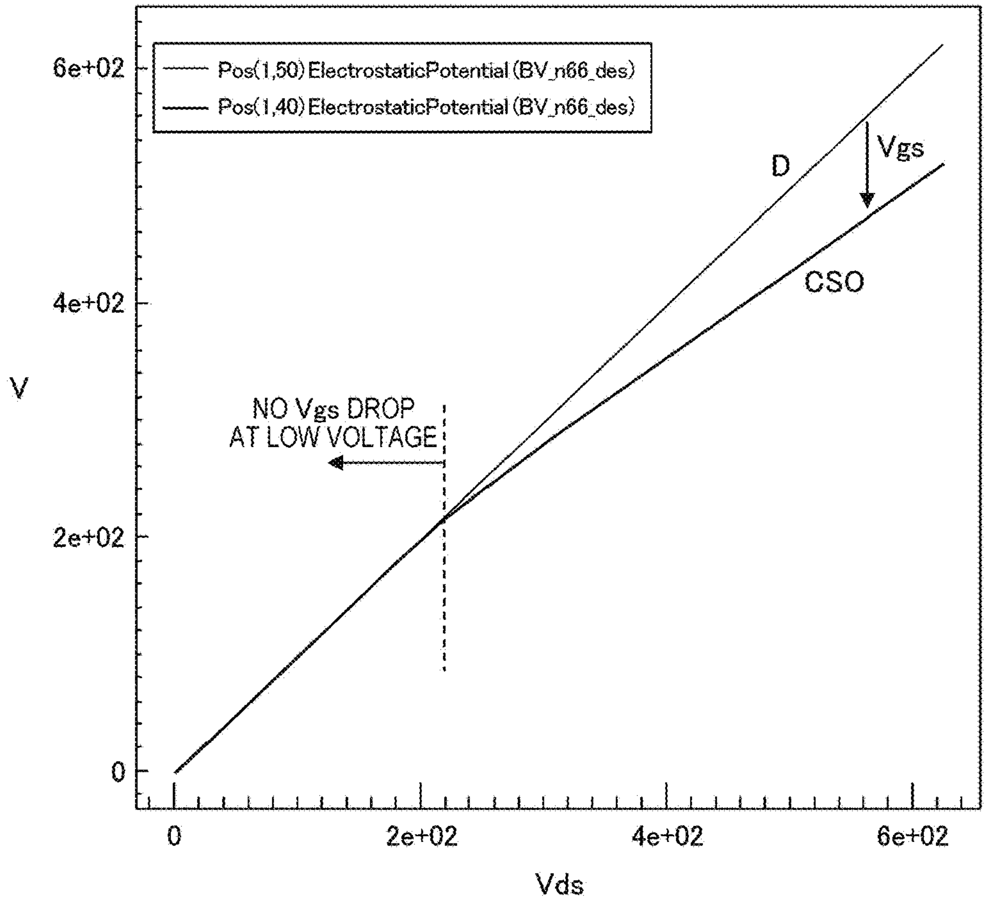
FIG. 3A is a diagram illustrating a simulation calculation result of each inter-terminal voltage according to the first embodiment of the present invention.
Figure 4A:
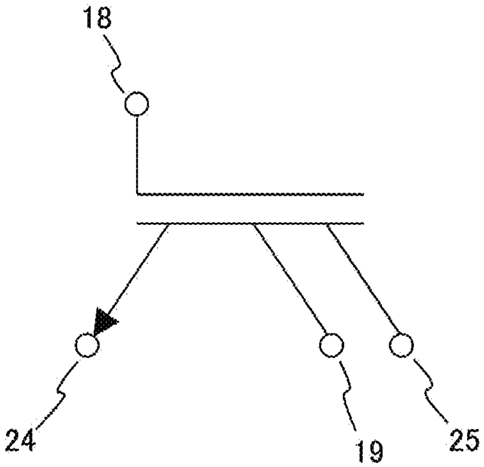
FIG. 4A is a diagram illustrating a modification of FIG. 1C.
Figure 4B:
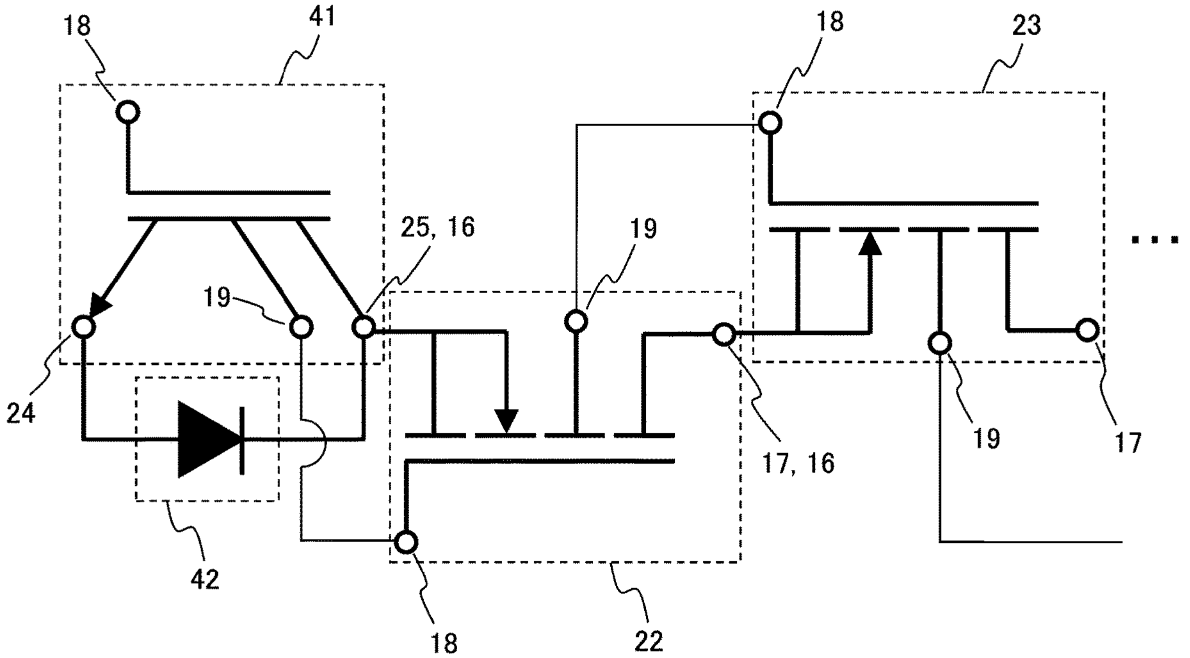
FIG. 4B is a diagram illustrating a modification of FIG. 2.

FIG. 3A illustrates a relationship between the voltage from the source terminal 16 to the drain terminal 17 and a voltage from the source terminal 16 to the control signal output terminal 19 obtained by simulation. In FIG. 3A, a horizontal axis represents a source-drain voltage Vds, and a vertical axis represents voltages of a drain (D) and a control signal output (CSO) with reference to a source.

A voltage from the drain terminal 17 to the control signal output terminal 19 of the lateral MOSFET 21 is applied from the source terminal 16 to the gate terminal 18 as a gate voltage Vgs of the lateral MOSFET 22 of the next stage.

As illustrated in FIG. 3A, in the lateral MOSFET 21, in a region where the voltage Vds from the source terminal 16 to the drain terminal 17 is relatively small, the voltage of the drain (D) and the voltage of the control signal output (CSO) substantially coincide with each other, and the voltage from the drain terminal 17 to the control signal output terminal 19 (the gate voltage Vgs applied to the lateral MOSFET 22 of the next stage) is very small, however, when the voltage Vds from the source terminal 16 to the drain terminal 17 increases to some extent, an absolute value of a difference between the voltage of the drain (D) and the voltage of the control signal output (CSO) increases, and the voltage (Vgs) from the drain terminal 17 to the control signal output terminal 19 has a negative sign and an increased absolute value. This is because a depletion layer does not extend to a position of the control signal output electrode 13 unless a voltage from the source electrode 11 to the drain electrode 12 increases to some extent in FIG. 1A.

Figure 3B:
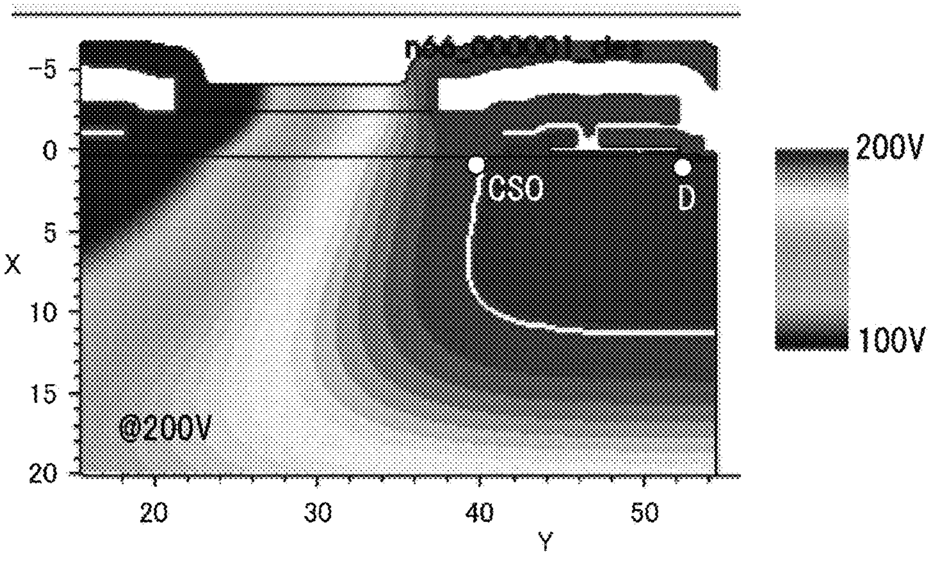
FIG. 3B is a diagram illustrating a simulation calculation result of potential distribution in a cross-section of the semiconductor device according to the first embodiment of the present invention.
Figure 3C:
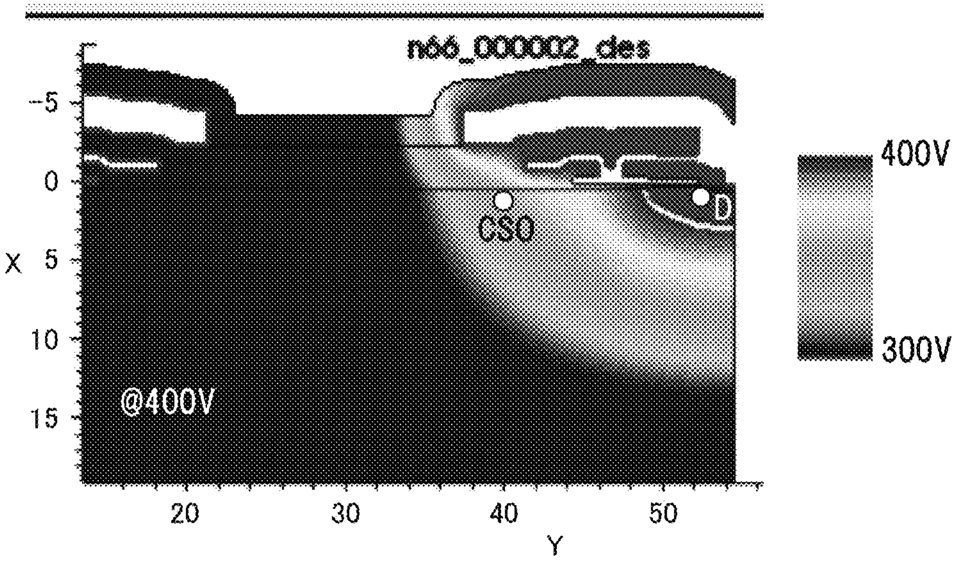
FIG. 3C is a diagram illustrating a simulation calculation result of potential distribution in the cross-section of the semiconductor device according to the first embodiment of the present invention.

As an example, FIG. 3B illustrates a potential distribution in the lateral MOSFET when the voltage from the source to the drain of the lateral MOSFET having a withstand voltage of 600 V is 200 V, and FIG. 3C illustrates the potential distribution in the lateral MOSFET when the voltage from the source to the drain is 400 V.

In FIG. 3B, the depletion layer does not extend to the control signal output (CSO), and the control signal output (CSO) and the drain (D) have substantially the same potential. On the other hand, in FIG. 3C, since the depletion layer extends to the control signal output (CSO), a potential difference is generated between the control signal output (CSO) and the drain (D), and the gate of the lateral MOSFET of the next stage is turned off.

From the above, since an absolute value of the voltage from the drain of the preceding stage to the control signal output applied as the gate voltage of the next stage is smaller than an absolute value (equal to an absolute value of the gate voltage of the next stage in a case of general cascode connection in which the gate of the next stage is connected to the source of the preceding stage) of the voltage from the source to the drain of the preceding stage and the next stage, it is found that a voltage stress applied to the gate oxide film of the lateral MOSFET of the next stage can be reduced as compared with the case of general cascode connection.

As described above, when the lateral MOSFET 21 is turned from the on state to the off state by the gate drive circuit, the voltage from the control signal output terminal 19 to the drain terminal 17 increases together with the voltage from the source terminal 16 to the drain terminal 17 of the lateral MSOFET 21.

Therefore, the voltage from the source terminal 16 to the gate terminal 18 of the lateral MOSFET 22 is reduced, and when the voltage falls below the negative gate threshold voltage, the lateral MOSFET 22 is turned off, and the voltage from the source terminal 16 to the drain terminal 17 and the voltage from the control signal output terminal 19 to the drain terminal 17 of the lateral MOSFET 22 increase.

Since the above operation is performed in a chain manner from the lateral MOSFET of the preceding stage toward the lateral MOSFET of the next stage, when the lateral MOSFET 21 is turned off, all the lateral MOSFETs of the second and subsequent stages connected in series are turned off, and application of the voltage can be prevented. Note that the lateral MOSFET of the first stage is the lateral MOSFET disposed at the foremost stage, and in FIG. 2, the lateral MOSFET 21 is the first stage, the lateral MOSFET 22 is the second stage, and the lateral MOSFET 23 is the third stage.

Conversely, when the lateral MOSFET 21 is turned on, all the lateral MOSFETs 22 and 23 of the second and subsequent stages connected in series are turned on, and a current can flow through the load.

Further, in a case where the load is connected in parallel to the lateral MOSFETs connected in series and the current flowing through the load flows back from the source side toward the drain side, the potential of the source is higher than the potential of the drain, so that all the lateral MOSFETs of the second and subsequent stages connected in series are turned on, and a return current can flow through the channel region 8.

Further, in the lateral MOSFET 21, when the gate is in the on state, the return current can flow through the channel region 8 similarly to the lateral MOSFET connected in series, but even when the gate is in the off state, the return current can flow through a built-in diode formed of the p-type contact region 6, the p-type base region 4, and the n-type semiconductor substrate 3.

As described above, the plurality of lateral MOSFETs connected in series can control on and off of all the lateral MOSFETs with one gate, and thus can be handled in the same manner as one power transistor in a conventional power electronics circuit.

<<Modifications>>

Modifications of the semiconductor device of the present embodiment described above will be described with reference to FIGS. 4A and 4B. FIGS. 4A and 4B are respectively modifications of FIGS. 1C and 2. Although the lateral MOSFET has been described above as an example, the low voltage element connected in series having reverse-connected IGBT and diode, and a high electron mobility transistor (HEMT) using a material such as gallium nitride (GaN) may be used.

FIG. 4A is a circuit diagram of the low voltage element constituting the semiconductor device according to the modification. As illustrated in FIG. 4A, the low voltage element (a lateral IGBT) constituting the semiconductor device of the modification is characterized in that the control signal output terminal 19 is added, as compared with a circuit configuration of a conventional lateral IGBT.

FIG. 4B is a circuit diagram illustrating a configuration of the semiconductor device of the modification. A difference from FIG. 2 is that the power transistor of the first stage is not the lateral MOSFET 21 but a lateral IGBT 41 including the control signal output terminal 19, and a diode 42 is connected in antiparallel to the lateral IGBT 41.

In a configuration of FIG. 4B, unlike the lateral MOSFET 21, the lateral IGBT 41 is provided with the diode 42 for return so as not to be reversely conducted.

In addition, although not illustrated, when the HEMT using the material such as gallium nitride (GaN) is used, it is possible to operate by synchronous rectification with a circuit configuration similar to that in FIG. 2. When the synchronous rectification is not used, it is necessary to connect a diode in antiparallel to the transistor of the first stage for a return operation as in FIG. 4B.

As described above, the semiconductor device of the present embodiment is a semiconductor device in which the first semiconductor element (lateral MOSFET 21, lateral IGBT 41) and one or a plurality of second semiconductor elements (lateral MOSFETs 22, 23) are connected in series, in which the first semiconductor element (lateral MOSFET 21, lateral IGBT 41) and the second semiconductor element (lateral MOSFETs 22, 23) each has the control signal output terminal 19 between the source terminal 16 and the drain terminal 17 or between an emitter terminal 24 and a collector terminal 25, and the gate terminal 18 of the second semiconductor element (lateral MOSFETs 22, 23) is connected to the control signal output terminal 19 of the first semiconductor element (lateral MOSFET 21, lateral IGBT 41) connected in series adjacent to the source or emitter side of the second semiconductor element (lateral MOSFETs 22, 23), or to the control signal output terminal 19 of the second semiconductor element (lateral MOSFETs 22, 23).

In addition, the gate terminal 18 and the source terminal 16 of the first semiconductor element (lateral MOSFET 21, lateral IGBT 41) are connected to the gate drive circuit, and it is possible to perform ON/OFF control of all the semiconductor elements of the first semiconductor element (lateral MOSFET 21, lateral IGBT 41) and the second semiconductor element (lateral MOSFETs 22, 23) by a drive signal from the gate drive circuit to the gate terminal 18 of the first semiconductor element (lateral MOSFET 21, lateral IGBT 41).

According to the present embodiment, in a cascode-type high voltage element configured by connecting a plurality of low voltage elements in series, by providing the control signal output electrode 13, the voltage is hardly applied to the gates of the second and subsequent stages, so that the withstand voltage of each low voltage element can be increased, and the number of stages of the low voltage elements to be connected can be reduced. In addition, since the voltage is hardly applied to the gates of the second and subsequent stages, the withstand voltage of the high voltage element can be designed without being limited by the withstand voltage of the gate oxide film of the low voltage element.

Second Embodiment

Figure 5:
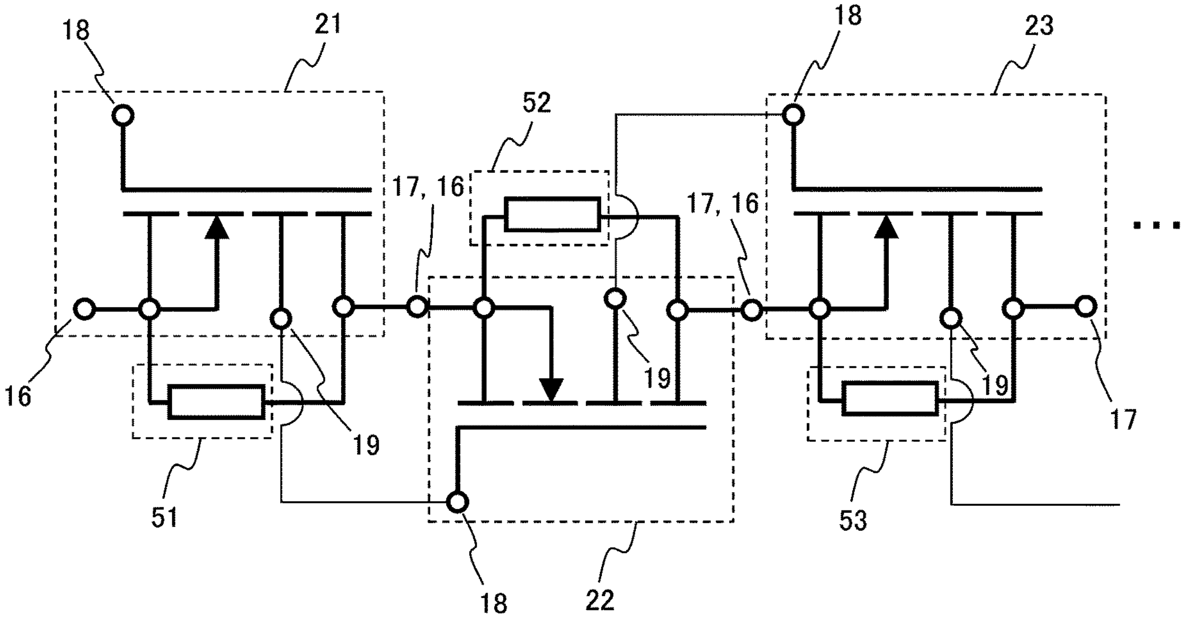
FIG. 5 is a circuit diagram illustrating a configuration of the semiconductor device according to a second embodiment of the present invention.

The semiconductor device according to a second embodiment of the present invention will be described with reference to FIG. 5. FIG. 5 is a circuit diagram illustrating a configuration of the semiconductor device of the present embodiment, and corresponds to FIG. 2 of the first embodiment.

As illustrated in FIG. 5, the semiconductor device of the present embodiment is characterized in that resistors 51, 52, and 53 are respectively connected in parallel between the source terminals 16 and the drain terminals 17 of the lateral MOSFETs 21, 22, and 23 provided with the control signal output terminals 19. Other configurations are similar to those in FIG. 2.

According to the present embodiment, when the lateral MOSFET with a resistor connected in parallel is regarded as one element, the resistance in the off state can be adjusted by the resistance of the resistor, so that sharing of the voltage when the lateral MOSFET connected in series is in the off state can be arbitrarily adjusted, and reliability of the element can be improved.

Third Embodiment

Figure 6:
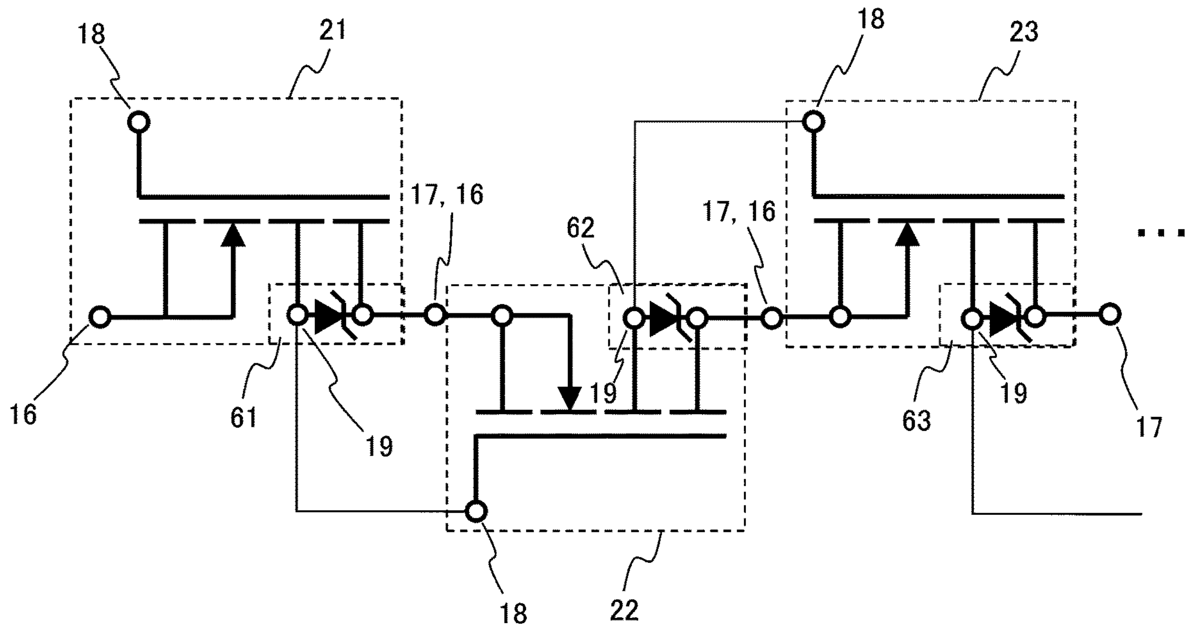
FIG. 6 is a circuit diagram illustrating a configuration of the semiconductor device according to a third embodiment of the present invention.

The semiconductor device according to a third embodiment of the present invention will be described with reference to FIG. 6. FIG. 6 is a circuit diagram illustrating a configuration of the semiconductor device of the present embodiment, and corresponds to FIG. 2 of the first embodiment.

As illustrated in FIG. 6, the semiconductor device of the present embodiment is characterized in that constant voltage diodes 61, 62, and 63 are respectively connected between the control signal output terminals 19 and the drain terminals 17 of the lateral MOSFETs 21, 22, and 23 provided with the control signal output terminals 19. Other configurations are similar to those in FIG. 2.

According to the present embodiment, when the voltage from the control signal output terminal 19 to the drain terminal 17 reaches a predetermined voltage in the off state of the lateral MOSFET, the voltage is clamped by the constant voltage diodes 61, 62, and 63, so that an excessive voltage can be prevented from being applied between the gate and the source of the lateral MOSFET connected in series on the drain side, and gate reliability of the lateral MOSFET can be improved.

Note that an avalanche diode or a Zener diode can be used as an example of the constant voltage diodes 61, 62, and 63.

Note that the present invention is not limited to the above-described embodiments, and includes various modifications. For example, the above-described embodiments have been described in detail for easy understanding of the present invention, and are not necessarily limited to those having all described configurations. Further, a part of configuration of a certain embodiment can be replaced with a configuration of another embodiment, and a configuration of another embodiment can be added to a configuration of a certain embodiment. Furthermore, another configuration can be added to, deleted from, or substituted for a part of configuration of each embodiment.

REFERENCE SIGNS LIST

1 support substrate
2 buried oxide film
3 n-type semiconductor substrate (drift region)
4 p-type base region
5 n-type source region
6 p-type contact region
7 n-type drain region
8 channel region
9 gate oxide film
10 gate electrode
11 source electrode
12 drain electrode
13 control signal output electrode
14 dielectric
15 element isolation region
16 source terminal
17 drain terminal
18 gate terminal
19 control signal output terminal
21, 22, 23 lateral MOSFET
24 emitter terminal
25 collector terminal
41 lateral IGBT
42 diode
51 resistor
52 resistor
53 resistor
61 constant voltage diode
62 constant voltage diode
63 constant voltage diode

The invention claimed is:

1. A semiconductor device in which a plurality of semiconductor element including a first semiconductor element and one or a plurality of second semiconductor elements are connected in series, wherein each of the first semiconductor element and the second semiconductor element is a transistor having a control signal output terminal connected to a part of a surface of a drift region between a first semiconductor region connected to a source terminal and a second semiconductor region connected to a drain terminal or between a first semiconductor region connected to an emitter terminal and a second semiconductor region connected to a collector terminal, the first semiconductor element is a first stage, and a gate terminal of the second semiconductor element is connected to the control signal output terminal of the semiconductor element of a preceding stage connected in series adjacent to a source or emitter side of the second semiconductor element.

2. The semiconductor device according to claim 1, wherein a gate terminal and a source terminal of the first semiconductor element are connected to a gate drive circuit, and ON/OFF control of all semiconductor elements of the first semiconductor element and the second semiconductor element is enabled by a drive signal from the gate drive circuit to the gate terminal of the first semiconductor element.

3. The semiconductor device according to claim 1, wherein the second semiconductor element is a depletion-type semiconductor element in which a threshold of a gate voltage is a negative voltage.

4. The semiconductor device according to claim 3, wherein the first semiconductor element and the second semiconductor element are lateral MOSFETs.

5. The semiconductor device according to claim 3, wherein at least one of the first semiconductor element and the second semiconductor element includes a lateral IGBT and a diode connected in antiparallel to the lateral IGBT.

6. The semiconductor device according to claim 3, wherein at least one of the first semiconductor element and the second semiconductor element is an HEMT.

7. The semiconductor device according to claim 6, wherein at least one of the first semiconductor element and the second semiconductor element includes an HEMT and a diode connected in antiparallel to the HEMT.

8. The semiconductor device according to claim 1, wherein a diode is connected between a drain terminal or a collector terminal and the control signal output terminal of each of the first semiconductor element and the second semiconductor element.

9. The semiconductor device according to claim 8, wherein the diode is an avalanche diode or a Zener diode.

10. A power converter using the semiconductor device according to claim 1.

* * * * *